United States Patent
Canadi

(10) Patent No.: US 10,090,683 B2
(45) Date of Patent: Oct. 2, 2018

(54) BATTERY MANAGEMENT SYSTEM FOR CONTROLLING AN ENERGY STORAGE ASSEMBLY AND METHOD FOR CHARGING AND DISCHARGING AN ENERGY STORAGE ASSEMBLY

(71) Applicant: H-Tech AG, Schaan (LI)

(72) Inventor: Samuel Canadi, Bad Urach (DE)

(73) Assignee: H-Tech AG, Schaan (LI)

( * ) Notice: Subject to any disclaimer, the term of this patent is extended or adjusted under 35 U.S.C. 154(b) by 215 days.

(21) Appl. No.: 15/036,742

(22) PCT Filed: Nov. 14, 2014

(86) PCT No.: PCT/EP2014/074599
§ 371 (c)(1),
(2) Date: Sep. 12, 2016

(87) PCT Pub. No.: WO2015/074964
PCT Pub. Date: May 28, 2015

(65) Prior Publication Data
US 2016/0372940 A1    Dec. 22, 2016

(30) Foreign Application Priority Data

Nov. 22, 2013   (DE) .................. 10 2013 112 923

(51) Int. Cl.
*H02J 7/00* (2006.01)
*G01R 31/36* (2006.01)
(Continued)

(52) U.S. Cl.
CPC ...... *H02J 7/0014* (2013.01); *G01R 19/16542* (2013.01); *G01R 31/3658* (2013.01);
(Continued)

(58) Field of Classification Search
CPC .................................................. H02J 7/0014
(Continued)

(56) References Cited

U.S. PATENT DOCUMENTS

| 5,543,245 A | 8/1996 | Andrieu et al. |
| 6,094,031 A * | 7/2000 | Shimane ............. B60L 11/1855 320/118 |

(Continued)

FOREIGN PATENT DOCUMENTS

| JP | 2006 138750 A | 6/2006 |
| JP | 2009 216448 A | 9/2009 |
| WO | 2005/091461 A1 | 9/2005 |

*Primary Examiner* — Suresh Memula
(74) *Attorney, Agent, or Firm* — Vorys, Sater, Seymour and Pease LLP; Vincent M DeLuca

(57) ABSTRACT

The invention relates to a battery management system for controlling an energy storage assembly, in particular for controlling the charging or discharging process of an energy storage device. The invention further relates to an energy storage assembly having a plurality of storage modules connected electrically in series, which energy storage assembly is controlled by an aforementioned battery management system. The invention further relates to a method for charging or discharging an aforementioned energy storage assembly. A battery management system (100) for controlling an energy storage assembly (10) is specified, which energy storage assembly comprises a plurality of storage modules (11, 12, 13, 14) connected electrically in series, wherein the battery management system (100) comprises: a measuring apparatus for measuring at least one value of a physical quantity of the storage modules (11, 12, 13, 14), a control apparatus (20), which controls a discharging current or charging current drawn from or supplied to the storage modules (11, 12, 13, 14) in dependence on the measured value of a physical quantity of at least one of the storage modules (11, 12, 13, 14), wherein the control appa-
(Continued)

ratus (20) checks if a value of a physical quantity of one of the storage modules (11, 12, 13, 14) changes more quickly than the corresponding values of the physical quantity of the other storage modules (11, 12, 13, 14) of the energy storage assembly (10) or if a value of a physical quantity of one of the storage modules (11, 12, 13, 14) changes more quickly than a specified change value for the value.

15 Claims, 7 Drawing Sheets

(51) Int. Cl.
    *H02J 7/14* (2006.01)
    *G01R 19/165* (2006.01)

(52) U.S. Cl.
    CPC ............ H02J 7/007 (2013.01); H02J 7/0021 (2013.01); H02J 7/1461 (2013.01); *H02J 2007/005* (2013.01); *Y02T 10/7011* (2013.01); *Y02T 10/7055* (2013.01)

(58) Field of Classification Search
    USPC ........................................................ 320/118
    See application file for complete search history.

(56) References Cited

U.S. PATENT DOCUMENTS

| | | |
|---|---|---|
| 2003/0146737 A1 | 8/2003 | Kadouchi et al. |
| 2005/0266303 A1 | 12/2005 | Kadouchi et al. |
| 2011/0309797 A1* | 12/2011 | Ciampolini ........... H02J 7/0018 320/118 |
| 2012/0146586 A1 | 6/2012 | Nishiyama et al. |
| 2014/0217958 A1* | 8/2014 | Verdun ................... H02J 7/007 320/107 |
| 2014/0266051 A1* | 9/2014 | Hayakawa ........... H02J 7/0016 320/118 |
| 2015/0340883 A1* | 11/2015 | Kanai ................ H01M 10/482 320/118 |
| 2015/0357843 A1* | 12/2015 | Kobayashi ........... H02J 7/0016 320/118 |
| 2016/0101705 A1* | 4/2016 | Kuraishi ............... H01M 10/44 320/109 |

* cited by examiner

BATTERY MANAGEMENT SYSTEM FOR CONTROLLING AN ENERGY STORAGE ASSEMBLY AND METHOD FOR CHARGING AND DISCHARGING AN ENERGY STORAGE ASSEMBLY

The invention relates to a battery management system for controlling an energy accumulator (or energy storage) arrangement, and in particular for controlling a charging or discharging operation of an energy accumulator arrangement. Furthermore, the invention relates to an energy accumulator arrangement having a plurality of accumulator modules connected in series, which energy accumulator arrangement is controlled by an aforementioned battery management system. The invention further relates to a method for charging or discharging an aforementioned energy accumulator arrangement.

Increasingly, storage lithium-ion accumulators are used for energy storage, in particular in electric and hybrid vehicles, but also in many other areas, such as portable electronic devices. The advantage of lithium-ion accumulators is a particularly high energy density along with low volume and weight. A drawback of lithium-ion accumulators is that they are very sensitive to overcharging, so that an operation within the prescribed tolerance limits and thus a long service life of the lithium-ion accumulators can only be ensured with appropriate protective circuits. Hereinafter, lithium-ion accumulators are also referred to as lithium-ion cells.

In conventional accumulators, such as NiCd or NiMH accumulators, such protective circuits are not required, since these accumulators are very robust. In contrast, even upon a slight overload the lithium-ion accumulator is damaged in the long term. The same applies to a deep discharge of lithium ion cells, which causes lasting damage to the cell. Thus, the cells of lithium-ion accumulators need to be monitored regularly to ensure a smooth and safe operation. For this, battery management systems are used, which ensure that the individual cells are not overloaded and are not discharged excessively.

Energy accumulator arrangements in electric and hybrid vehicles, but also in other battery-powered devices, are usually composed of a series connection of several accumulator modules, wherein one accumulator module may have a plurality of cells. The cells are usually installed in so-called accumulator packs or sheets, wherein the individual cells within these sheets can only to a limited extent be monitored separately. Within the accumulator packs or sheets, the cells are connected in series and/or in parallel. However, since several sheets or accumulator packs are connected in series, it is possible to ensure the monitoring of the accumulator modules or sheets. For this, the individual accumulator packs or accumulator modules have separate terminals, that allow the voltage to be checked and the cells located in said accumulator module to be charged and discharged individually. During a charging or discharging operation the voltage of the individual accumulator modules is monitored by the battery management system.

Among the most important tasks of a battery management system is monitoring the charging and discharging of an energy accumulator arrangement comprising a plurality of accumulator modules connected in series, wherein the accumulator modules are formed by several interconnected cells. As mentioned above, lithium-based accumulator modules have a high sensitivity for too low and too high voltages, which have to be monitored and prevented by a battery management system. To this end, the battery management system monitors, in addition to the charging and discharging, the temperature and also takes over the control of the charge equalization between the individual accumulator modules, if necessary.

When using lithium-based accumulator modules, the battery management system serves as an interface between the electrical loads or generators incorporated into the vehicle and the accumulator modules incorporated into the battery. Herein, the battery management system both monitors the battery and controls the battery depending on the function or operating state of the vehicle. Thus, the battery management system performs, for example, the activation of the battery during the operation of the vehicle or the standby control when the vehicle is not moving, or performs the charging operation when the battery of the vehicle is charged when it is not operational.

In electric vehicles, the battery management system in particular includes contactors to control an electrical isolation between the battery and the electric components of the vehicle. In case of an accident, for example, the battery management system performs the function of opening the contactors in case corresponding sensors of the vehicle are responsive and thus completely electrically and galvanically isolating the energy accumulator arrangement from the vehicle.

Conventional battery management systems monitor, among many other functions, the charging and discharging operations of the accumulator modules of an energy accumulator arrangement. However, it is only monitored whether the end-of-charge voltage and end-of-discharge voltage is reached or a termination of the charging operation or discharging operation is activated within a tolerance range near the defined voltage limits.

However, during daily use modern accumulator modules or single lithium-based cells within the accumulator modules can experience abnormalities that require a more flexible control of the battery management system in order to ensure, on the one hand, an improved usability of the connected loads and, on the other hand, an improved protection of the accumulator modules or an extended lifetime of the accumulator modules.

It is, for example, possible that, in case of an interconnection of many lithium-based cells in an accumulator module, one of the cells or an entire accumulator module behaves differently than the other accumulator modules connected in series to this accumulator module. These abnormalities can be of varying nature and, for example, originate from states that only occur temporarily in accumulator modules or take place in ranges of physical quantities of the accumulator modules that occur within tolerance limits and in particular between end-of-charge voltage or end-of-discharge voltage.

Conventional battery management systems monitor these parameters profiles or profiles of physical quantities of accumulator modules within the end-of-charge voltage or end-of-discharge voltage inadequately or not at all.

Therefore, an object of the invention is to provide a battery management system for controlling an energy accumulator arrangement or a method for charging or discharging an energy accumulator arrangement which solves the aforementioned problems.

In particular, the battery management system according to the invention or the method according to the invention allows temporary abnormalities within the accumulator modules or the cells during charging or discharging of accumulator modules to be responded to and the charging or discharging operation of the accumulator modules or the entire energy accumulator arrangement to be controlled accordingly.

The invention is based on the idea that, in the accumulator modules of the energy accumulator arrangement, which are connected in series, not only uniform parameter profiles or profiles of physical quantities arise during charging or discharging. According to the invention, deviations in the parameter profiles, even if they are within the range end-of-charge voltage and end-of-discharge voltage, are detected and taken into account in the continued control of charging and discharging.

Taking into account a deviation during a normal charging or discharging operation results, on the one hand, in a longer life of the accumulator modules and thus of the entire energy accumulator arrangement. On the other hand, it allows the device with the energy accumulator arrangement according to the invention to be used longer or continually, which is of considerable importance, in particular for electric vehicles, since the mileage that can be achieved with a battery charge is the decisive criterion for electric vehicles. A failure or disconnection of the energy accumulator arrangement due to an abnormality during charging or in particular during discharging leads to a termination of the usage, which is extremely unpleasant in case of an electric vehicle, since the user, as a result, only reaches the destination with external assistance.

Therefore, the battery management system provided according to the invention includes a measuring device for detecting at least one value of a physical quantity of the accumulator modules and a control device controlling the discharge or charging current based on the detected physical value of at least one of the accumulator modules.

To this end, the control device checks, whether a value of a physical quantity of one of the accumulator modules is changing faster than the corresponding values of a physical quantity of the other accumulator modules of the energy accumulator arrangement and/or whether a value of a physical quantity of one of the accumulator modules is changing faster than a predetermined change value for the physical quantity.

Using such a battery management system it is thus possible to detect a too rapid or abnormal voltage rise during charging or a too rapid or abnormal voltage drop during discharging and to affect the entire charging or discharging operation based thereon.

For this purpose, the battery management system preferably includes a memory device in which the values of physical quantities of accumulator modules are stored. In particular, values of physical quantities can be stored therein, in order to judge whether one of the measured physical quantities such as voltage, current or temperature behaves differently than the comparative values stored in the memory device.

In particular, a given change value for the monitored physical quantity may be stored in the memory device. That is, it is stored in the memory device, how much the voltage, the temperature or the current may change per unit of time, respectively.

If a deviation among the measured values at the accumulator modules occurs or a deviation of the measured physical values of the accumulator modules in comparison to the values of the physical quantities stored in the memory device occurs, the control device acts upon the discharging current or charging current accordingly.

This can prevent that the charging or discharging operation is kept unadjusted and thus the end-of-charge voltage is reached very quickly in case of a more rapid or too rapid voltage rise and, as a result, a full charging of the accumulator modules potentially is not possible because the conventional battery management system would terminate the charging operation then.

The battery management system according to the invention is coupled to a device for current limitation or comprises a device for current limitation in order to influence the charging or discharging current. Based on the comparison of the measured value of the physical quantity with the corresponding values of other accumulator modules or with the given change value for the physical quantity from the memory device, the internal or external device for current limitation is activated or deactivated in response to control signals of the control device so as to limit the charging current or the discharging current, respectively, which is fed to the accumulator modules of the energy accumulator arrangement or drawn therefrom.

In another embodiment it is possible that the battery management system alternatively outputs a control signal to control an internal or external device for current limitation which is received by an external control device of the electrical load or a charging device and influences the load or the charging operation accordingly. Thus, it is possible, for example, that, in case of a deviation of the measured value of the physical quantity from the other corresponding values or from the stored change value, a control signal is output to the on-board computer of an electric vehicle by the control device in order to inform it that an abnormality has occurred in the energy accumulator arrangement and, for example, only a reduced current is available for the load.

By reducing and/or completely terminating the charging/discharging operation in case of a determined abnormality or anomaly, the accumulator module is given the opportunity to return to a state situated within the normal range with the help of a lower load or a lower charging current. Often, the abnormal states in accumulator modules are reached, in particular, by working with maximum charging currents or discharging currents, by which the accumulator modules are lead to the edge of their load limits. Other reasons for the occurrence of temporary abnormalities during charging or discharging may be manufacturing tolerances or aging of cells in the accumulator modules. In addition, an abnormality may occur due to the physical structure and a resultant different burden on the individual cells or due to a partial defect (e.g. individual cells within an accumulator module are electrically isolated by mechanical overload). If then, in accordance with the invention, the burden on the accumulator module or all of the energy accumulator arrangement is temporarily reduced or is temporarily suspended, the single accumulator module in which the abnormality has occurred has the opportunity to return to a stable state.

To this end, the value of a physical quantity is preferably continuously detected by the battery management system according to the invention. If the deviating or abnormal value of the physical quantity returns to a normal range, the load limitation or the limitation of the charging current can be suspended. It may be provided that the battery management system, in particular the affected accumulator module, in which the abnormality has occurred, continues to be monitored.

If the abnormality occurs again under normal load or during normal charging, the invention proposes to counter this abnormality with a different or enhanced measure.

For this purpose, it is provided, for example, that, after a load limitation upon the first abnormality and a recurrence of an abnormality, either a stronger load limitation will be set or a load interruption is provided for a preset time. It is also possible to extend the times after which it is checked whether the abnormality is still present in case of a recurrent abnormality in the same accumulator module.

According to the invention, the control device checks whether a voltage value of one of the accumulator modules changes more rapidly than the voltage values of the other accumulator modules of the energy accumulator arrangement or whether a voltage value of one of the accumulator modules changes more rapidly than a voltage change value stored in the memory device. If a deviation or abnormality is detected during charging, that is, a voltage change value is exceeded at one of the accumulator modules or the voltage rises more rapidly here than in the other accumulator modules, a charging current limitation is activated for all accumulator modules.

If, on the other hand, an abnormal voltage change is detected during discharging, that is, the voltage drops more rapidly at one of the accumulator modules than at the other accumulator modules, a discharging current limitation is activated for all accumulator modules. That is, according to the invention both a more rapid rise in the voltage or generally in the value of a physical quantity or a faster drop in a voltage or generally in a value of a physical quantity in one of the accumulator modules is monitored and, consequently, a charging current limitation or a discharging current limitation is activated for all accumulator modules.

Preferably, the control device deactivates the charging current limitation after the voltage change value is again consistent with the values of the other accumulator modules or the stored values.

Preferably, it is also possible for the control device to deactivate the discharging current limitation after dropping below the voltage change or another predetermined voltage change value. That is, in the case in which the rise or the drop of the monitored value of the physical quantity returns to a normal range, the charging current limitation or the discharging current limitation is deactivated.

Alternatively or additionally it may be provided that the charging current or discharging current limitation is maintained or gradually reduced. If the charging current or discharging current limitation is maintained, the energy accumulator arrangement, for example, has to undergo maintenance before the original applicable charging currents or discharging currents are re-enabled.

Alternatively or additionally, it may be provided that, in the memory device, different voltage change values are stored for different charging current values and/or for different voltage change values are stored for different discharging current values and the limitation of the charging or discharging currents is adjusted depending on the charging current values or discharging current values. When working with a very high discharging current, the limitation will be more strict in case of an abnormality than at a lower discharging current, since the chance of damage to the accumulator module is greater for a very high discharging current and an abnormality than for a low discharging current, for which the discharging current has to be limited less strictly in case of an abnormality of.

This has the advantage that at high charging currents or high discharging currents even smaller deviations in the voltage change value can be responded to. At comparatively low charging current values or discharging current values, however, a deviation of the voltage change value is acceptable for a longer time, so that the control means is not yet responding in this case.

The object is also achieved by an energy accumulator arrangement including a plurality of accumulator modules electrically connected in series comprising a battery management system described above.

Moreover, the object is also achieved by a method for charging and discharging a energy accumulator arrangement, wherein the energy accumulator arrangement includes a plurality of accumulator modules electrically connected in series.

The method comprises the steps of detecting at least one value of a physical quantity of the accumulator module; checking whether a value of a physical quantity of one of the accumulator modules changes more rapidly than a value of the physical quantity of the other accumulator modules of the energy accumulator arrangement or whether a value of a physical quantity of one of the accumulator modules changes more rapidly than a predetermined change value for a physical quantity and controlling the discharging current or the charging current, which is drawn from or supplied to the accumulator modules based on the check.

The battery management system according to the invention makes it possible for the cells or the accumulator modules in case of abnormalities to return to their normal range without completely deactivating the energy accumulator arrangement and thus to ensure a continued use of the device or electric vehicle.

In the following the present invention will be explained in more detail with reference to figures. In the drawings.

DETAILED DESCRIPTION OF THE FIGURES

Figure 1:
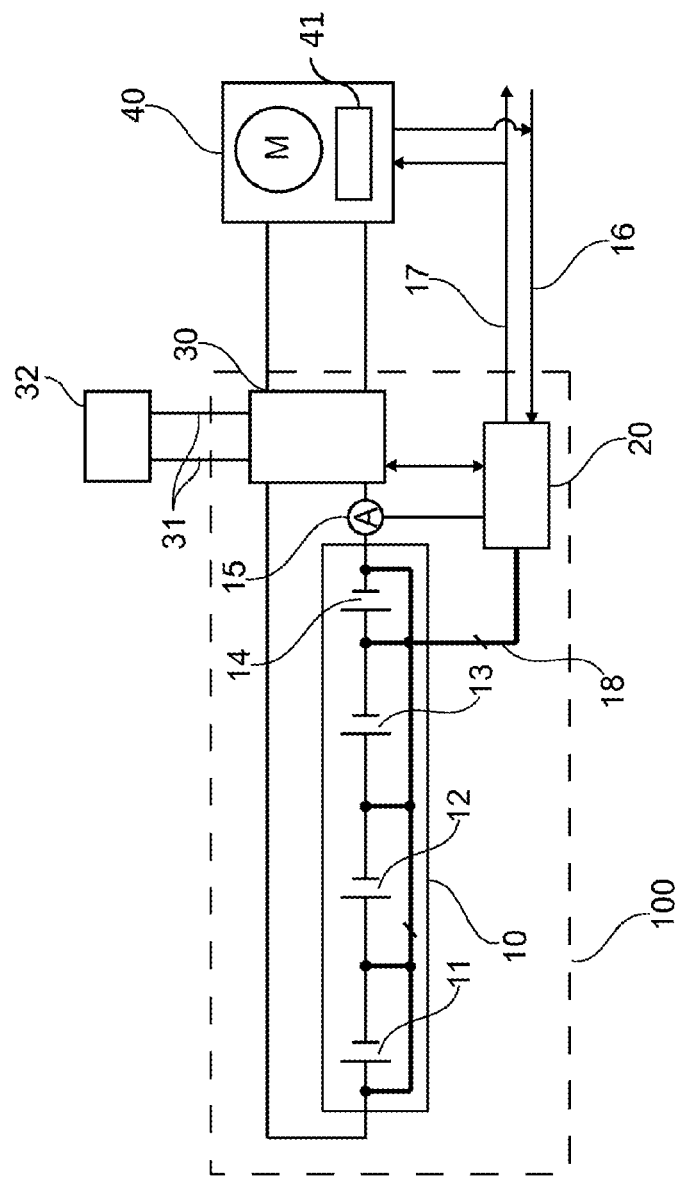
FIG. 1 shows a schematic diagram of a first battery management system according to the invention.

FIG. 1 shows a battery management system 100 for controlling an energy accumulator arrangement 10. The energy accumulator arrangement 10 includes four accumulator modules 11, 12, 14 and 14. In this example, these are connected in series. In the accumulator modules 11, 12, 13 and 14, a plurality of cells are connected in parallel or in series, wherein the individual accumulator modules in the energy accumulator arrangement 10 are then connected in series. The interconnection of the individual cells within the accumulator modules then has an impact on the voltage applied at the external terminals of the accumulator modules. However, it is not essential for the explanation or implementation of the present invention which form the connection of the individual cells inside the accumulator modules 11, 12, 13 and 14 takes. The accumulator modules 11, 12, 13 and 14 connected in series may include any number of cells connected in parallel, as ideal cells connected in parallel behave as one large cell.

The energy accumulator arrangement 10 is connected to a control device 20. The control device 20 has a voltage monitoring functionality that detects the voltage across each accumulator module 11, 12, 13 and 14. For this purpose, the control device 20 is connected to the individual accumulator modules 11, 12, 13 and 14 via a voltage detection bus 18. Furthermore, the battery management system includes an ammeter or a device for current measurement 15. Said ammeter 15 is connected to a supply line in order to measure the charging or discharging current and provide this value to the control device 20.

In addition, the control device 20 may instruct the device for current measurement 15, when a current value is to be detected or when it is to be transmitted to the control device 20. This means that the detection period can be adjusted.

The battery management system according to the invention includes, in one embodiment, a current limitation unit 30. The current limitation unit 30 is connected to both supply lines to the energy accumulator arrangement 10 and is controlled by the control device 20.

The control device 20 also includes an input 16 via which signals from one or more external systems or from a load are received. Moreover, the control device 20 includes an output 17 via which via the signals are transmitted to external systems or to a load 40.

The load 40 which is powered by the energy accumulator arrangement 10 may, for example, be an electric motor. As shown in FIG. 1, the load 40 may, in addition to the actual load M, also comprise a control unit 41, which receives signals from the control device 20 in addition to signals from other external devices. Moreover, the control unit 41 in the load 40 outputs signals which are transmitted, inter alia, to the controller 201 as well as to external components.

The current limitation unit 30 also comprises terminals 31 via which the energy accumulator arrangement 10 is charged during the charging process. The terminals 31 may alternatively be located outside of the current limitation unit 30 to supply a charging current from a charger 32 during charging.

Preferably, controllable switches are included in the current limitation unit 30 via which the supplied charging current or the drawn discharging current can be controlled. For this purpose, the switches may be pulsed, so that the current amount (charge amount) can be reduced with respect to a unit of time.

The easiest way for current limitation is to open the switches, so that no current can be drawn.

Figure 2:
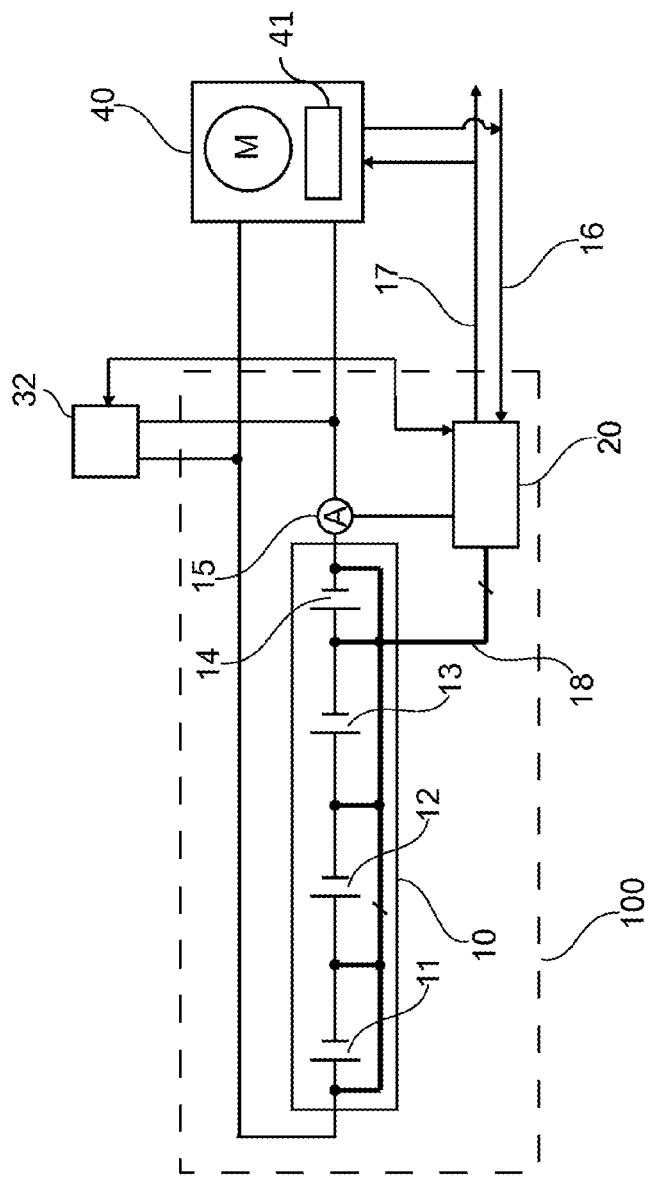
FIG. 2 shows a schematic diagram of a battery management system according to a second exemplary embodiment.

FIG. 2 shows an alternative embodiment of a battery management system. In this alternative embodiment, the energy accumulator arrangement 10 is structured analogously to the energy accumulator arrangement shown in FIG. 1. The same applies to the device for current measurement 15 and to the control device 20. The control device 20 in the alternative embodiment communicates with the charger 32 or with the load 40. That is, in the second exemplary embodiment of the battery management system according to the invention not device for current limitation is provided, since the control device 20 communicates directly with the charger or the load and their control units and thus can act upon the limitation of the charging current or the discharging current in a very detailed manner.

Figure 3:
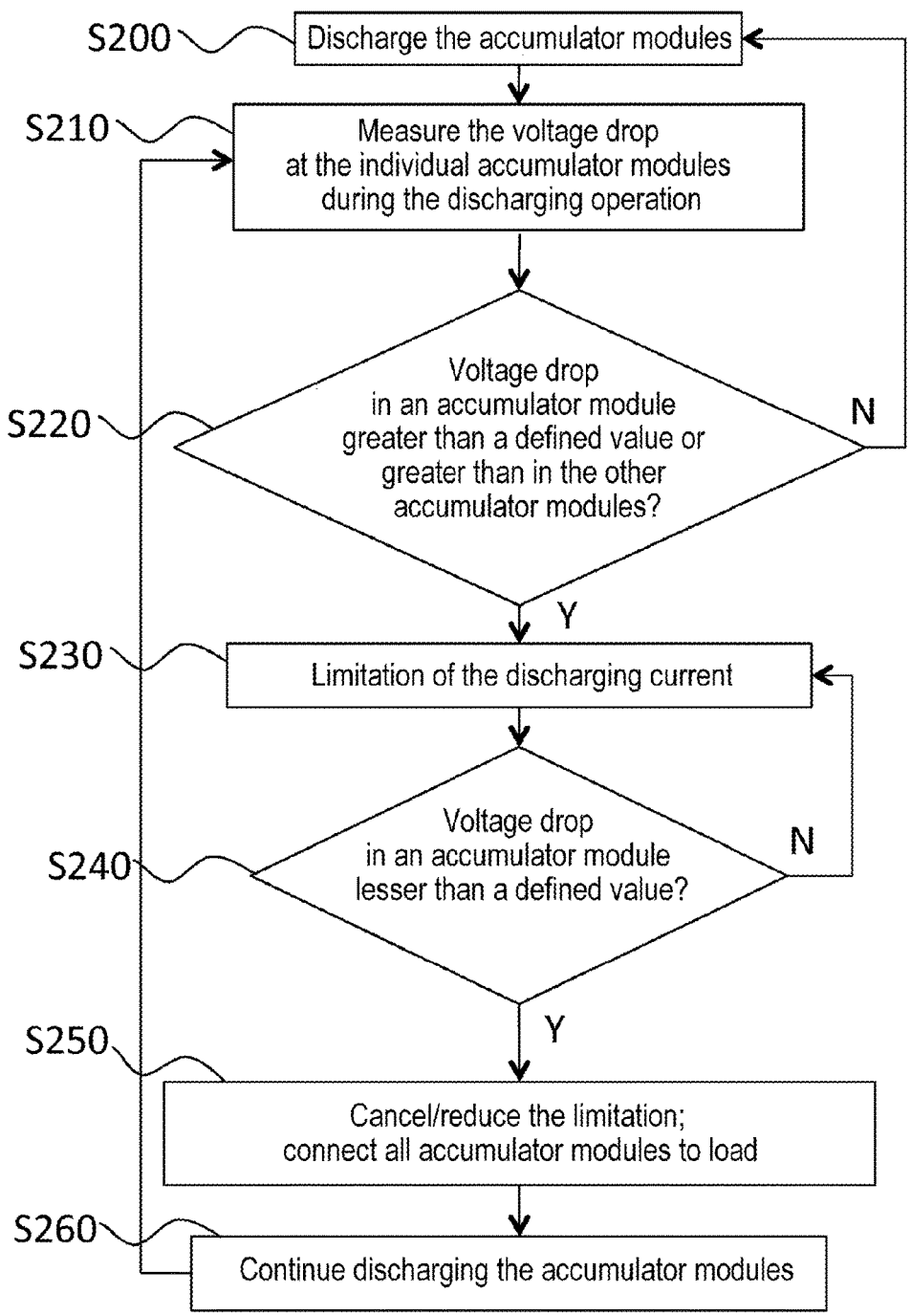
FIG. 3 is a flow chart for the charging operation of an energy accumulator arrangement using a battery management system according to the invention.

FIG. 3 shows a flow chart in which the method for controlling the discharging operation of the accumulator modules is described. The accumulator modules are discharged in step S200. After the start of the discharging operation, in other words after switching on the load, the voltage drop at each of the accumulator modules 11, 12, 13, and 14 is measured continuously or periodically and fed to the control device 20 via the bus 18. The control device 20 converts the detected voltages into digital values and compares these voltage values with values stored in the accumulator module of the control device 20 or in an external (not shown) memory arrangement.

Alternatively and/or additionally, the control device 20 checks, whether the voltage drop in one of the accumulator modules 11, 12, 13, or 14 is higher or greater than in other accumulator modules 11, 12, 13, or 14. If there no abnormal voltage drop, which is greater than a defined value and/or greater than in the other accumulator modules, is detected, the accumulator modules are discharged further.

However, if the control device 20 detects such an abnormal voltage drop, a signal is output to the current limitation unit 30 or to the load 40 and/or their control unit 41, thereby limiting the discharging current.

If the signal is sent to the load 40 by the control device 20 as indication of an abnormality, the control unit 41 of the load 40 may limit the motor speed, so as to reduce the drawn current (discharging current) thereby.

If the signal is sent by the control device 20 as indication of an abnormality to the current limitation unit 30, the latter may limit the current drain, i.e. the discharging current, by a pulsed switch. In extreme cases, the current limitation unit 30 may interrupt the current drain completely, wherein the current limitation unit 30 interrupts the lines to the load, for example, by means of one or a plurality of switches.

For example, if after a predetermined amount of time $t_p$ the measured voltage drop in the accumulator module having the abnormality is again lower than a defined value, which is verified in step S240, the control device 20 outputs a signal to the load unit 40 or current limitation unit 30 to suspend the limitation of the load.

If the voltage drop during the checking in step S240 is not lower than a defined value, the limitation of the discharging current of step S230 is maintained. While not shown, it is then possible to tighten the limitation. If the checking has a positive result, charge is drawn S260 limitlessly after terminating S250 the limitation of the accumulator modules, wherein in step S210 a further continuous or periodic checking of the voltage drop is performed in each of the accumulator modules during the discharging operation.

Figure 4:
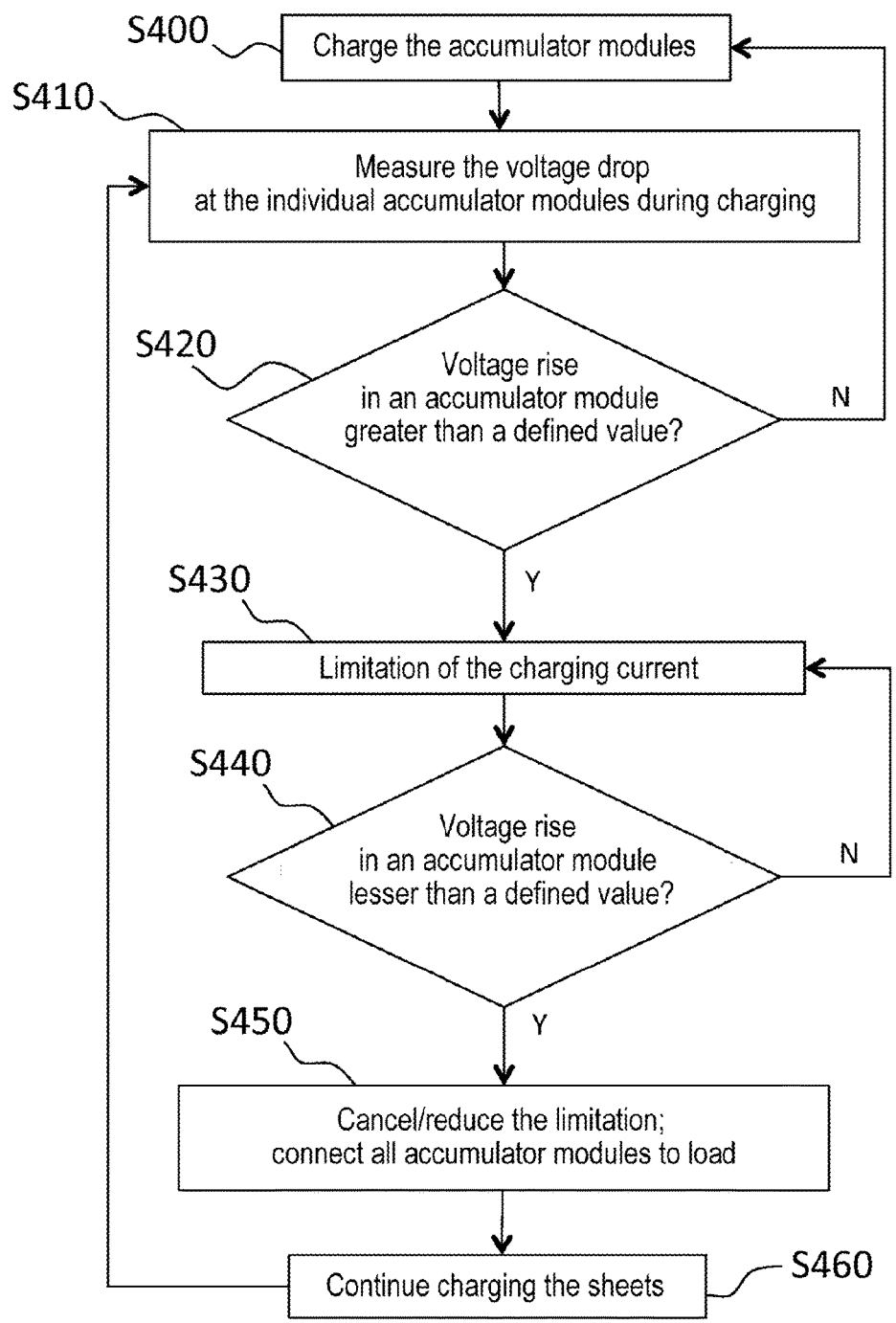
FIG. 4 is a flow chart for the discharging operation of an energy accumulator arrangement using a battery management system according to the invention.

In FIG. 4, a flow chart of a discharging operation of an energy accumulating arrangement 10 including a battery management system 100 according to the invention is shown. In step S400, the accumulator modules are charged and/or the charging process is started. In S410, the voltage at each accumulator module is detected via the bus 18 during charging and the detected voltage values are transmitted to the control device 20. In step S420, a voltage rise in each accumulator module is checked. In particular, it is checked in step S420, whether the voltage rise in one of the accumulator modules 11, 12, 13, or 14 is greater than a defined value stored in a memory arrangement in the control device 20 and/or if a voltage rise in one of the accumulator modules 11, 12, 13, or 14 is greater than a voltage rise in the other accumulator modules 11, 12, 13, or 14. If this is not the case, the proceeding returns to step S400 and the accumulator modules are charged further.

If it is detected during the checking S420, that the voltage rise in one of the accumulator modules is greater than a defined value or than in the other accumulator modules, the charging current is limited in step S430. On the one hand, this may be implemented by the control device 20 outputting a signal to the current limitation unit 30 and the latter limiting the amount of charge supplied to the energy accumulating arrangement 10 by pulsing the current supply.

Alternatively, the control device 20 according to the second embodiment in FIG. 2 outputs a signal to the charger 32 in order to reduce the charging current. Afterwards in S440, it is checked, whether the voltage rise in the affected accumulator module, in which the voltage rise beyond a defined range has occurred before, is lower than a defined value. This defined value for terminating the limitation may correspond to the upper defined value used in S420 for the activation of the limitation. However, the values may differ. Thus, the activation in S420 may occur faster, i.e. at a lower value of the voltage rise, than the termination of the limitation in S440.

If the voltage rise is less than a defined value and/or less than or equal to the other accumulator modules during checking in S440, the limitation of the charging current is terminated S450 and the accumulator modules are further charged regularly. Here, the limitation may also be reduced gradually to a normal level. However, if the voltage rise has not been reduced by the limitation of the charging current in the affected accumulator module, the limitation of the charging current S430 is maintained or tightened. In a particular embodiment the limitation is maintained until the energy accumulating arrangement undergoes maintenance.

Figure 5:
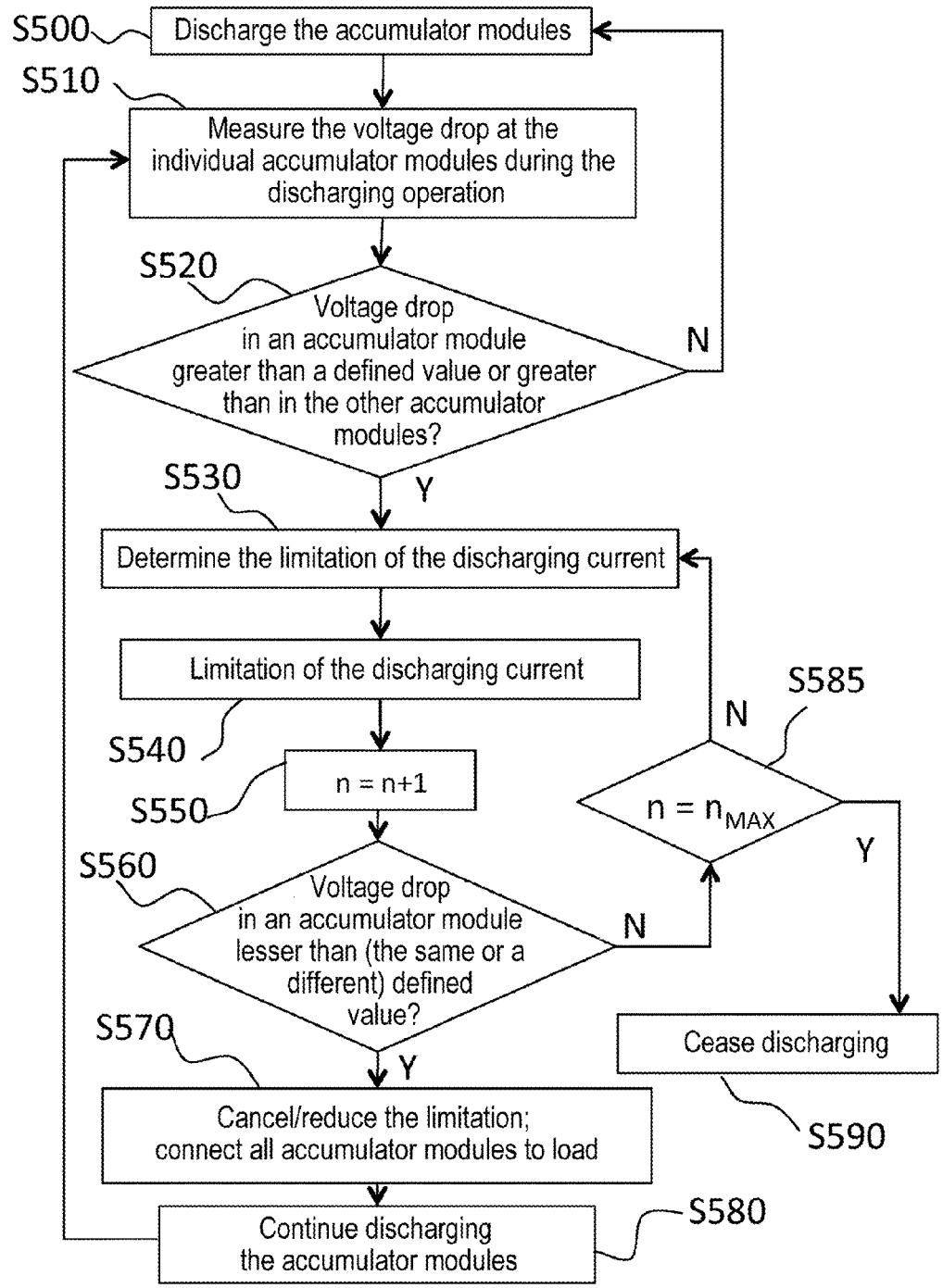
FIG. 5 is a flow chart of another exemplary embodiment according to the invention.

An example embodiment taking into account the level of the limitation of the charging current or the limitation of the discharging current is illustrated in FIG. 5.

Furthermore, the flow chart according to FIG. 5 illustrates, that the frequency of the limitation of the charging current due to an abnormality is detected in order to avoid a total failure of the accumulator modules, if a one-time or repeated limiting of the charging current and the discharging current is not sufficient to prevent the abnormal voltage rise and voltage drop, respectively, and to return the behaviour of the affected accumulator module to the normal range.

from the abnormality due to the limitation of the discharging current or due to the complete shutdown of the discharging current.

In step S500, the discharging operation of the accumulator modules is started, for example, when the driver of an electric vehicle operates the accelerator pedal and thus starts the motor, which then requires a current which is drawn from the energy accumulator arrangement 10. During this discharging operation, the voltage drop is checked or measured at the individual accumulator modules in step S510. This is performed via the bus 18 which is connected to the respective terminals of the individual accumulator modules 11, 12, 13 and 14, wherein corresponding voltage values are transmitted to the control device 20. The control device 20 checks in step S520 whether a voltage drop in one of the accumulator modules is greater than a defined value and/or whether a voltage drop in one of the accumulator modules is greater than in the other accumulator modules. If this not the case, the discharging operation continues in step S500. When an abnormality is detected in step S520 it is determined in the control device 20, for example, using a table or using a formula, how strictly the discharging current is to be limited.

To this end, it is provided, for example, to set a limitation to 10% of the discharging current at a discharging current of 1 A, for example. In other words the load is reduced by 10% and the load is only provided with 90%, i.e. 0.9 A. In another embodiment, it is possible to set the limitation of the discharging current to 20% in case of a discharging current of 2 A. Furthermore, the time of waiting until it is checked again, whether the voltage drop across the affected accumulator module still prevails or not can be determined from the table or based on a formula.

In step S540, the discharging current is then limited based on the determined discharging current and/or the particular time. In step S550, a counter n is incremented to determine

| Discharging/charging current | Reduction of discharging/charging current by | 1. Abnormality (Reduction, time until next measurement) | 2. Abnormality (Reduction, time until next measurement) | 3. Abnormality (Reduction, time until next measurement) | 4. Abnormality (Reduction and time until next measurement) |
|---|---|---|---|---|---|
| 1 A | 10% | 10% + 10 sec | 20% + 20 sec | 50% + 50 sec | Switch off |
| 2 A | 20% | 20% + 10 sec | 40% + 40 sec | Switch off | |
| 3 A | 30% | 30% + 10 sec | Switch off | | |

In the exemplary embodiment shown in FIG. 5, it is described with reference to the discharging operation of the accumulator modules that the limitation of the discharging current upon detection of an abnormality or an abnormality is performed incrementally or as a function of the absolute magnitude of the discharging current. That is, in all the embodiments described above, it is possible to make the amount of the limitation of the discharging current dependent on how high the discharging current is in absolute terms. That is, for a very high discharging current in absolute terms a stricter limitation is carried out than for a lower discharging current. Another factor described in this embodiment and is also applicable to all other embodiments is the determination of the time period $t_p$ of waiting until it is checked again whether an abnormality in the affected accumulator module still prevails.

This ensures that, for a high discharging current, the cell or the accumulator module has sufficient time to recover how often an abnormality has occurred. Herein, a distinction can be made whether the abnormality was determined for the entire accumulator arrangement or for individual accumulator modules, which is a statement of quality for the entire energy accumulator arrangement. Alternatively or additionally, it is possible to detect the number or frequency of the detection of abnormalities in relation to individual accumulator modules. In other words, in step S550, on the one hand an abnormality for the entire energy accumulator arrangement may be detected at all and/or the frequency of abnormality for each accumulator module may be detected. If the abnormality is eliminated and the voltage drop is again within the tolerance range or in the normal range, the limitation of the discharging current is terminated in step S560 and the current limitation unit 30 is instructed accordingly by the control device 20 to suspend the current limitation or a signal is output by the control device 20 to the control unit 41 of the load 40 to indicate that the limitation is terminated S570. After that, the accumulator modules are further discharged S580.

If, however, after the predetermined time and the check in step S560, still a voltage drop at the affected accumulator module, which is outside of the defined range, is present, it is checked in step S585 whether the counter n set in step S550 corresponds to a predetermined value $n_{max}$. If this predetermined number $n_{max}$ is reached, the discharging is terminated by disconnecting the energy accumulator arrangement 10 from the load via the current limitation unit 30. If the predetermined value $n_{max}$ for the maximum number of abnormalities is not reached in step S585, it is again determined by the control device 20, for example by calculating the discharging current using a table or a formula, to which value the discharging current is limited in the renewed cycle based on n. The easiest way is to make the limitation of the discharging current always the same. In accordance with more sophisticated systems, it is possible that, with an increasing number of abnormalities, the amount of the limitation of the discharging current increases and/or the time of waiting until it is checked, whether or not the abnormal voltage drop still exists, increases.

In particular, it is possible to adjust the amount of limitation or reduction depending on the size of the deviation. Moreover, it is possible to adjust the amount of the limitation or reduction depending on the absolute value of the discharging/charging current. Alternatively or additionally, it is possible to adjust the duration until the check depending on the absolute value of the discharging/charging current and/or the size of the deviation.

Figure 6:
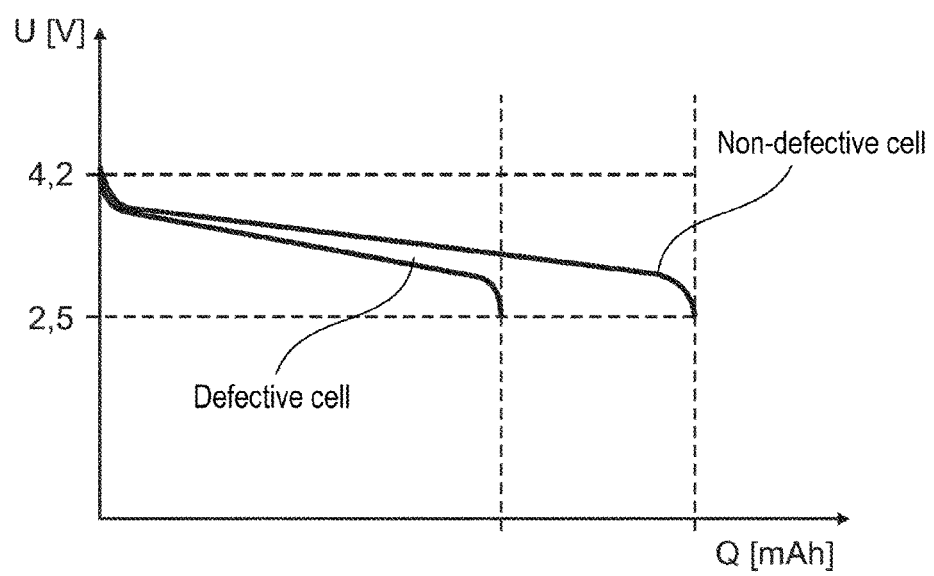
FIG. 6 is a diagram for illustrating the charging of 100% functional or partly defective energy accumulator arrangements.

FIG. 6 shows a diagram in which the voltage profiles are of a non-defective and a defective accumulator module are compared. Both accumulator modules ideally have the end-of-charge voltage of 4.2 V at the beginning of their discharge operation. If an accumulator module is limited in its performance by constant use or extreme stress or is defective, its charging capacity is reduced, i.e. the accumulator module can accumulate less charge and possibly reaches the end-of-discharge voltage of 2.5 V more rapidly than the non defective accumulator module during discharge.

Figure 7:
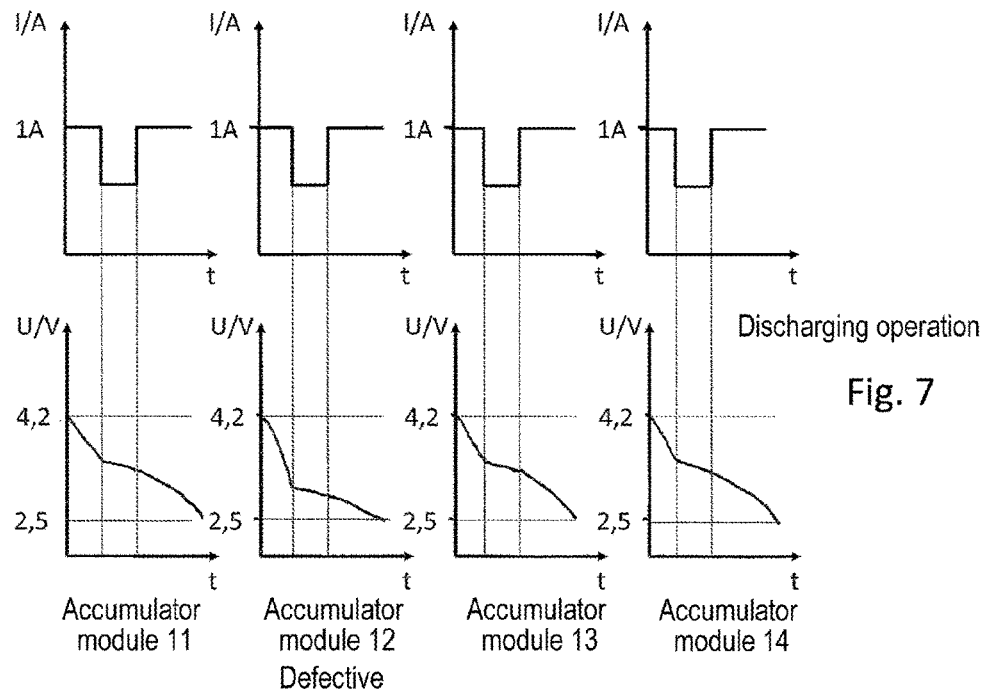
FIG. 7 shows voltage and current profiles for illustrating the invention during discharging.

FIG. 7 shows the voltage and current profiles during discharge of an energy accumulator arrangement according to the invention. It is shown that the accumulator modules 11, 12, 13 and 14 are initially discharged at 1 A, wherein the voltage slowly decreases from a end-of-charge voltage of 4.2 V. Herein, it is apparent that the voltage at the defective accumulator module 12 drops more rapidly or faster than at the other accumulator modules 11, 13 and 14. After the greater or more rapid voltage drop is detected at the accumulator module 12, the drawn discharging current is limited in all of the accumulator modules, since they are connected in series. It is apparent that the voltage drop in all of the accumulator modules 11, 12, 13 and 14 becomes slower due to the limitation of the discharging current, in this case due to a reduction on the load side. After a predetermined time tp, it is checked whether the voltage drop is again within a normal range in the affected accumulator module 12. If the voltage drop in all of the accumulator modules 11, 12, 13 and 14 is equal and within the normal range, the abnormality could thus be overcome by limiting the discharging current. Then, according to the invention, the limitation is suspended and the previously used discharging current is again allowed.

During discharge, a complete shutdown can be carried out in the current limitation unit 30. On the other hand, a reduction of the discharging current may be obtained by a signal to the load 40 or its control unit 41.

Figure 8:
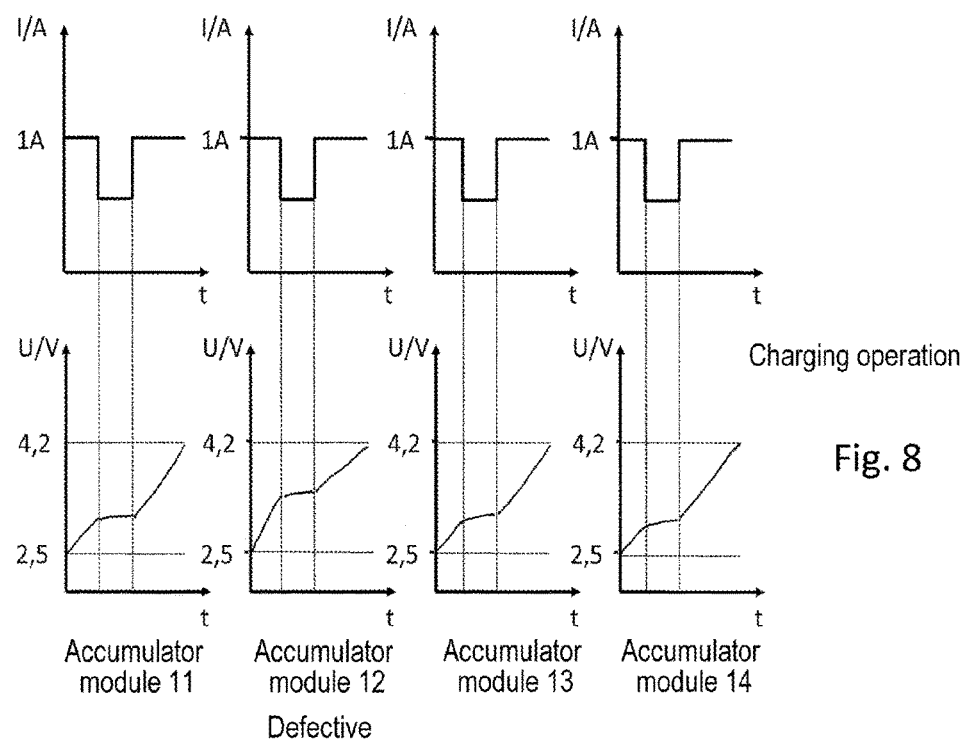
FIG. 8 shows voltage and current profiles for illustrating the invention during charging.

A similar observation can be made for the charging operation, which is shown in FIG. 8. During charging the limitation of the charging current may, on the one hand, be perm formed by the charger 32 which receives a corresponding signal from the control unit 20. Alternatively or in addition, the supply of the charging current can also take place in the current limitation unit 30 by a pulsing of the supplied charging current.

FIG. 8 shows the voltage/current profiles during charging of an energy accumulator arrangement according to the invention. It is shown that the accumulator modules 11, 12, 13, 14 are initially charged with 1 A, wherein the voltage increases slowly from a end-of-discharge voltage of 2.5 V, for example. If the accumulator modules 11, 12, 13, 14 are not completely discharged, the voltage increases during charging from a voltage above the end-of-discharge voltage of 2.5 V.

According to FIG. 8, it is apparent that, at the defective accumulator module 12, the voltage increases faster or more rapidly than at the other accumulator modules 11, 12, 13 and 14. After the faster or more rapid voltage rise at the accumulator module 12 has been detected by the control device 20, the charging current in all of the accumulator modules 11, 12, 13, 14 is limited. This can be seen in the upper part of FIG. 8. In the lower part, it is apparent that the voltage increase during charging in all of the accumulator modules 11-14 is slower due to the limitation of the charging current, e.g., due to appropriate settings at the charger 32 or due to an appropriate circuit in the current limitation unit 30. While it is not shown in FIG. 8, it is equally possible according to the invention to interrupt the supply of the charging current for a certain time in case of an abnormality. During an interruption, the voltage in the individual accumulator modules would then no longer increase. According to FIG. 8, it can be seen that the voltage in the individual accumulator modules increases only slightly during the limitation of the charging current.

After a predetermined time $t_p$, it is checked whether the voltage rise in the affected accumulator module 12 is again within a normal range, that is, whether the voltage rise either corresponds to the voltage rise in the other accumulator modules 11, 13 and 14 or corresponds to predetermined voltage rise values. If the voltage rise, after the predetermined time $t_p$, is within the normal range again in all of the accumulator modules, the abnormality could be overcome due to the limitation of the charging current. Then, the limitation of the charging current according to the present invention is terminated and the charging current previously used is supplied. It is also possible to apply a reduced charging current (or discharging current during discharge) afterwards.

With the present battery management system according to the invention and/or the method of charging or discharging an energy accumulator arrangement, abnormalities during charging or during discharging may be detected. Due to a temporary limitation or temporary interruption of the charging or discharging operation according to the invention a possibility is created to allow the accumulator modules of the energy accumulator arrangement to settle and thus allow a continuation of the charging or discharging operation without major technical interventions.

On the other hand, the battery management system according to the invention ensures that in the case of a continuing abnormality the continuation of the charging or discharging is interrupted, if no change in the abnormal or deviating increase or decrease in the voltage curve of the accumulator modules can be seen after one or more limitations of the charging or discharging current. Thus, the safety during charging and discharging of the energy accumulator arrangement is guaranteed.

The invention claimed is:

1. A battery management system for controlling an energy accumulator arrangement comprising a plurality of accumulator modules electrically connected in series, said battery management system comprising:
   a measuring device for detecting at least one value of a physical quantity of said accumulator modules;
   a control device limiting a discharging current drawn from said accumulator modules during discharging or a charging current supplied to said accumulator modules during charging, based on the detected value of a physical quantity of at least one of said accumulator modules;
   a memory device for storing values of the detected physical quantities and/or of change values for physical quantities of said accumulator modules;
   wherein said control device limits the discharging current or the charging current based on the check whether a value of a physical quantity of one of said accumulator modules changes more rapidly during charging or discharging than the corresponding values of the physical quantity of said other accumulator modules of said energy accumulator arrangement or whether a value of a physical quantity of one of said accumulator modules is changing more rapidly than a change value for the physical quantity stored in said memory device; and
   wherein said control device reduces the charging current limitation or the discharging current limitation if the change of the value of the physical quantity of the corresponding accumulator module no longer deviates from the change values of the physical quantity of the other accumulator modules or reaches a predetermined change value of the physical quantity.

2. The battery management system of claim 1, wherein said control device controls the discharging current and/or the charging current based on a comparison of the at least one detected value of the physical quantity of at least one of said accumulator modules with a value of the physical quantity of the accumulator modules stored in said memory device and/or based on a comparison with a predetermined change value for the physical quantity.

3. The battery management system according to claim 1, wherein the measuring device detects the voltage, the current and/or the temperature of said accumulator modules as a physical quantity.

4. The battery management system according to claim 1, wherein said control device outputs a signal to an external control unit for influencing the discharging current in case of a deviation during discharging or outputs a signal to a charger for influencing the supplied charging current in case of a deviation during charging.

5. The battery management system according to claim 1, wherein said battery management system is coupled to a current limitation unit or includes a current limitation unit, wherein said current limitation unit is activated and/or deactivated in response to control signals from said control device, in order to limit the charging current and/or the discharging current supplied to or drawn from said accumulator modules of said energy accumulator arrangement.

6. The battery management system according to claim 1, wherein said control device checks whether a voltage value of one of said accumulator modules changes more rapidly than the voltage values of the other accumulator modules of said energy accumulator arrangement or whether a voltage value of one of said accumulator modules changes more rapidly than a voltage change value stored in said memory device.

7. The battery management system of claim 6, wherein said control device activates a charging current limitation or a discharging current limitation for all of said accumulator modules in case of a deviation of the voltage change at one of said accumulator modules.

8. The battery management system according to claim 6, wherein said control device deactivates the charging current limitation or the discharging current limitation if the voltage change of the corresponding accumulator module no longer deviates from the voltage change values of the other accumulator modules or reaches a predetermined voltage change value.

9. The battery management system according to claim 6, wherein said control device reduces the charging current limitation or the discharging current limitation if the voltage change of the corresponding accumulator module no longer deviates from the voltage change values of the other accumulator modules or reaches a predetermined voltage change value.

10. The battery management system according to claim 1, wherein different voltage change values are stored in said memory device for different charging current values and/or discharging current values.

11. The battery management system according to claim 1, wherein the number (n) of deviations in an accumulator module from the other accumulator modules or from stored values is recorded and is taken into account for controlling the charging current and/or the discharging current limitation.

12. The battery management system according to claim 1, wherein the size of the charging current and/or the discharging current limitation is adjusted depending on the supplied charging current or drawn discharging current.

13. The battery management system according to claim 1, wherein the duration for checking, whether an accumulator module with a determined deviation of a physical quantity is behaving normally again, is adjusted depending on the supplied charging current or drawn discharging current and/or the absolute value of the determined deviation.

14. An energy accumulator arrangement, comprising:
   a plurality of accumulator modules electrically connected in series; and
   a battery management system configured to control said plurality of accumulator modules, said battery management system including:
      a measuring device for detecting at least one value of a physical quantity of said accumulator modules,
      a control device limiting a discharging current drawn from said accumulator modules during discharging or a charging current supplied to said accumulator modules during charging, based on the detected value of a physical quantity of at least one of said accumulator modules,
      a memory device for storing values of the detected physical quantities and/or of change values for physical quantities of said accumulator modules,
      wherein said control device limits the discharging current or the charging current based on the check whether a value of a physical quantity of one of said accumulator modules changes more rapidly during charging or discharging than the corresponding values of the physical quantity of said other accumulator modules of said energy accumulator arrangement or whether a value of a physical quantity of one of said accumulator modules is changing more rapidly than a change value for the physical quantity stored in said memory device, and wherein said control device reduces the charging current limitation or the discharging current limitation if the change of the value of the physical quantity of the corresponding accumulator module no longer deviates from the change values of the physical quantity of the other accumulator modules or reaches a predetermined change value of the physical quantity.

15. A method for charging or discharging an energy accumulator arrangement including a plurality of accumulator modules electrically connected in series, said method comprising:

detecting at least one value of a physical quantity of said accumulator modules, checking whether a value of a physical quantity of one of said accumulator modules changes more rapidly during charging or discharging than a corresponding value of a physical quantity of the other accumulator modules of said energy accumulator arrangement and/or whether a value of a physical quantity of one of said accumulator modules changes more rapidly than a change value for the physical quantity stored in a memory device;

limiting the charging current supplied to said accumulator modules during charging based on the checking, or limiting the discharging current drawn from said accumulator modules during charging based on the checking; and reducing the charging current limitation during charging or the discharging current limitation during discharging if the change of the value of the physical quantity of the corresponding accumulator module no longer deviates from the change values of the physical quantity of the other accumulator modules or reaches a predetermined change value of the physical quantity.

* * * * *